United States Patent
Sekiya et al.

(10) Patent No.: US 10,601,453 B2
(45) Date of Patent: Mar. 24, 2020

(54) ELECTRONIC CONTROL UNIT

(71) Applicants: SOKEN, INC., Nisshin, Aichi-pref. (JP); DENSO CORPORATION, Kariya, Aichi-pref. (JP)

(72) Inventors: Youhei Sekiya, Nisshin (JP); Hiroyuki Mori, Nisshin (JP); Tomohisa Kishigami, Kariya (JP)

(73) Assignees: SOKEN, INC., Nisshin (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 16/392,814

(22) Filed: Apr. 24, 2019

(65) Prior Publication Data

US 2020/0067546 A1   Feb. 27, 2020

(30) Foreign Application Priority Data

Aug. 22, 2018  (JP) ................. 2018-155419

(51) Int. Cl.

| H03D 1/04 | (2006.01) |
|---|---|
| H04B 1/10 | (2006.01) |
| H04B 1/16 | (2006.01) |
| H03K 17/687 | (2006.01) |
| H03K 5/1252 | (2006.01) |

(52) U.S. Cl.
CPC ............ H04B 1/10 (2013.01); H03K 5/1252 (2013.01); H03K 17/6872 (2013.01); H04B 1/16 (2013.01)

(58) Field of Classification Search
CPC .......... H04B 1/10; H04B 1/16; H03K 5/1252; H03K 17/6872

USPC ............................................ 375/346
See application file for complete search history.

(56) References Cited

U.S. PATENT DOCUMENTS

| 4,539,617 A * | 9/1985 | Delaney ............. H02H 9/04 323/230 |
|---|---|---|
| 5,955,889 A | 9/1999 | Taguchi et al. |
| 6,384,671 B1 | 5/2002 | Taguchi et al. |
| 10,020,841 B2 * | 7/2018 | De Haas ............. H04L 25/0272 |
| 2006/0164777 A1 * | 7/2006 | Ferianz ............. H04M 1/745 361/93.1 |
| 2011/0169547 A1 * | 7/2011 | Suzuki ............ H03K 19/00361 327/384 |
| 2012/0293230 A1 | 11/2012 | Mori et al. |

(Continued)

FOREIGN PATENT DOCUMENTS

| JP | 10-198473 A | 7/1998 |
|---|---|---|
| JP | 11-098197 A | 4/1999 |

(Continued)

*Primary Examiner* — Helene E Tayong
(74) *Attorney, Agent, or Firm* — Posz Law Group, PLC

(57) ABSTRACT

An electronic control unit coupled to a transmission line of a differential signal includes: a first suppression circuit suppressing a ringing effect and decreasing an impedance of the line for a first time interval when a level of the differential signal changes; a second suppression circuits suppressing a ringing effect and decreasing the impedance of the line for a second time interval when the level of the differential signal changes; and a switching unit isolating the second suppression circuit from the line when the operation power source energizes the electronic control unit, and connecting the second suppression circuit to the line when the operation power source does not energize the electronic control unit.

5 Claims, 11 Drawing Sheets

(56) References Cited

U.S. PATENT DOCUMENTS

| | | |
|---|---|---|
| 2016/0036604 A1 | 2/2016 | Mori et al. |
| 2016/0365881 A1 | 12/2016 | Kishigami et al. |
| 2017/0262394 A1 | 9/2017 | De Haas et al. |
| 2018/0367127 A1* | 12/2018 | Honda ............. H03K 19/00361 |

FOREIGN PATENT DOCUMENTS

| | | |
|---|---|---|
| JP | 2000-069062 A | 3/2000 |
| JP | 2001-313680 A | 11/2001 |
| JP | 2011-151591 A | 8/2011 |
| JP | 2017-216579 A | 12/2017 |

* cited by examiner

ELECTRONIC CONTROL UNIT

CROSS REFERENCE TO RELATED APPLICATION

The present application claims the benefit of priority from Japanese Patent Application No. 2018-155419 filed on Aug. 22, 2018. The entire disclosure of the above application is incorporated herein by reference.

TECHNICAL FIELD

The present disclosure relates to an electronic control unit which is coupled to a transmission line transmitting a differential signal by a pair of signal line and performs communication with another device.

BACKGROUND

In the case of transmitting a digital signal via a transmission line, there is a problem that, on the reception side, due to reflection of a part of signal energy at a timing that a signal level changes, a waveform distortion such as overshoot or undershoot, that is, ringing occurs.

For example, as a ringing suppression circuit suppressing ringing which occurs in a differential signal transmitted in a transmission line, a ringing suppression circuit operated by power source voltage supplied (hereinbelow, a power-source-necessary suppression circuit) is provided.

For example, as a ringing suppression circuit, a ringing suppression circuit (hereinbelow, a power-source-unnecessary suppression circuit) operated by voltage between a pair of signal lines constructing a transmission line without power source voltage supplied is provided.

SUMMARY

According to an example embodiment, an electronic control unit coupled to a transmission line of a differential signal includes: a first suppression circuit suppressing a ringing effect and decreasing an impedance of the line for a first time interval when a level of the differential signal changes; a second suppression circuits suppressing a ringing effect and decreasing the impedance of the line for a second time interval when the level of the differential signal changes; and a switching unit isolating the second suppression circuit from the line when the operation power source energizes the electronic control unit, and connecting the second suppression circuit to the line when the operation power source does not energize the electronic control unit.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
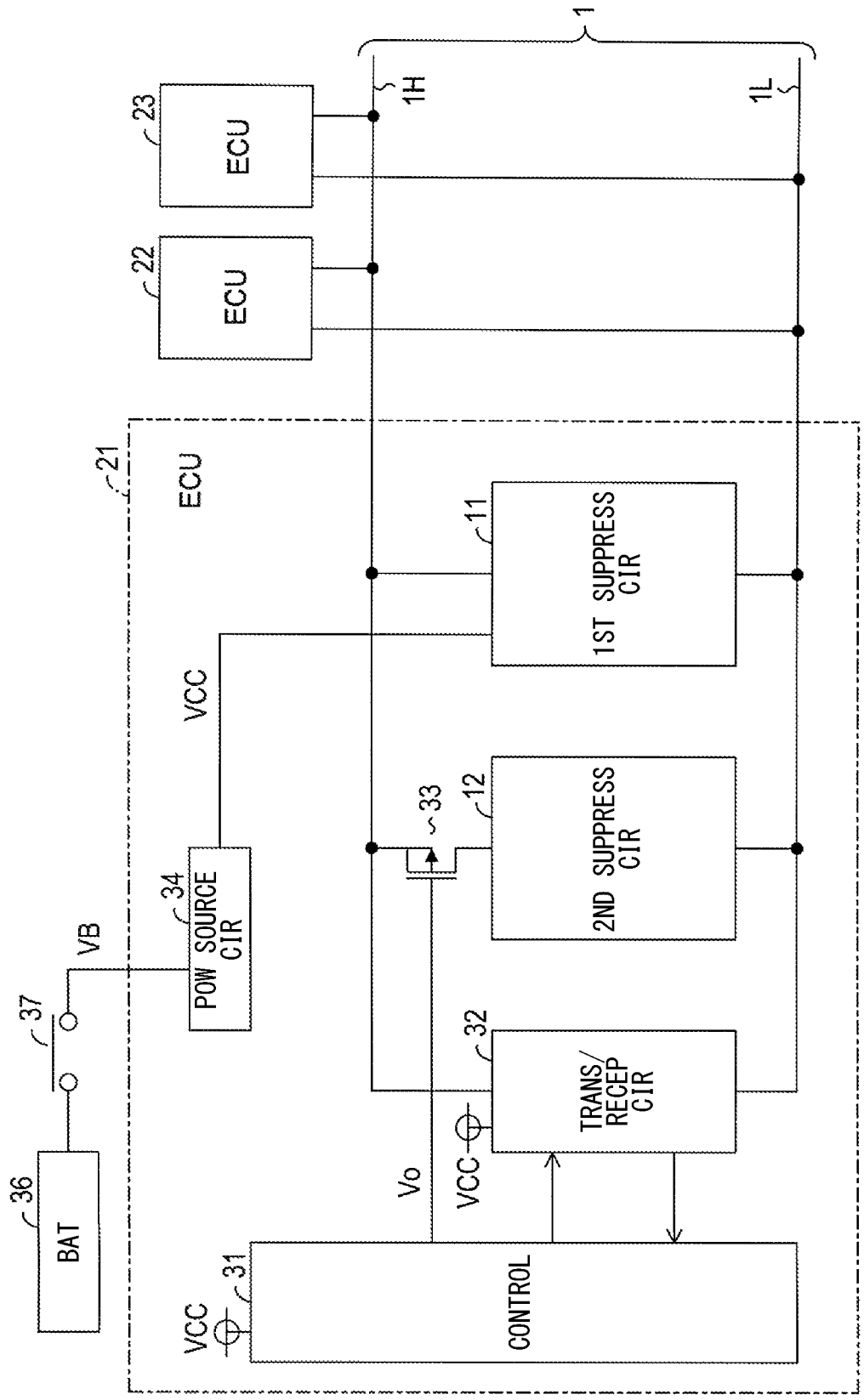
FIG. 1 is a block diagram illustrating the configuration of an electronic control unit of a first embodiment.

Each of a power-source-necessary suppression circuit and a power-source-unnecessary suppression circuit is basically configured to suppress ringing by decreasing impedance between a pair of signal lines when the level of a differential signal changes.

However, the power-source-unnecessary suppression circuit is constructed by analog circuit parts such as a capacitor and a transistor and, on the other hand, the power-source-necessary suppression circuit is constructed by also using parts which can perform more complicated operation than a transistor single body such as a flip flop, a logic gate circuit, and a capacitor. Consequently, the power-source-necessary suppression circuit can have a higher-level ringing suppression function as compared with that of the power-source-unnecessary suppression circuit.

For example, in the power-source-necessary suppression circuit, when the level of a differential signal changes, the state of decreasing the impedance between a pair of signal lines is fixed by a flip flop. After counting predetermined time, the flip flop is reset and the impedance decrease state is cancelled. Consequently, it is easy to set execution time of operation of decreasing the impedance between signal lines to predetermined time. For example, the power-source-necessary suppression circuit has a function of decreasing impedance between signal lines for all of a period in which the signal level on a transmission line becomes recessive since detection of an arbitration win from comparison between transmission data and reception data until end of transmission of a communication frame.

As a result of detailed examination of the inventors of the present disclosure, the following problems were found.

In a communication system in which a plurality of electronic control units perform communication via a transmission line, it is considered to provide each of the electronic control units with a power-source-necessary suppression circuit as a ringing suppression circuit. In this case, each of the electronic control units may be configured to supply power source voltage to the power-source-necessary suppression circuit for a period that the operation power source is supplied to the electronic control unit.

In the case of a communication system in which electronic control units having different periods of supply of the operation power source exist, a situation occurs such that, in a state where the operation power source to a part of the plurality of electronic control units is interrupted, the other remaining electronic control units perform communication. In such a situation, since the operation of the power-source-necessary suppression circuit of the electronic control unit to which the operation power source is interrupted first stops, a ringing suppression effect by the power-source-necessary suppression circuit is lost.

Consequently, it is considered to provide each of the electronic control units with a power-source-necessary suppression circuit and a power-source-unnecessary suppression circuit. With such a configuration, even an electronic control unit to which the operation power source is interrupted can contribute to ringing suppression by the power-source-unnecessary suppression circuit.

However, by providing the electronic control unit with both the power-source-necessary suppression circuit and the power-source-unnecessary suppression circuit, a new problem occurs. Specifically, in the case where the operation power source is supplied to the electronic control unit, both the power-source-necessary suppression circuit and the power-source-unnecessary suppression circuit operate. There is consequently the possibility that the impedance between a pair of signal lines is decreased too much and an inconvenience occurs in signal transmission (that is, communication).

According to one aspect of the present disclosure, an electronic control unit capable of obtaining an excellent ringing suppressing effect in both of the case where operation power source is supplied and the case where the operation power source is not supplied is provided.

According to an example embodiment, an electronic control unit is coupled to a transmission line transmitting a differential signal, which changes between a high level and a low level, via a pair of a high-potential-side signal line and a low-potential-side signal line, and communicates with at least another device via the transmission line. The electronic control unit includes: a first suppression circuit and a second suppression circuit for suppressing a ringing effect which occurs in transmission of the differential signal; and a switching unit. The first suppression circuit is configured to operate using an operation power source energizing the electronic control unit for operating the electronic control unit, and is configured to have at least one function of decreasing an impedance between the pair of signal lines for a first predetermined time interval when a level of the differential signal changes. The second suppression circuit is configured to operate by a voltage between the pair of signal lines, and configured to decrease the impedance between the pair of signal lines for a second predetermined time interval when the level of the differential signal changes. The switching unit is configured to isolate the second suppression circuit from the pair of signal lines when the operation power source energizes the electronic control unit and the electronic control unit functions, and configured to connect the second suppression circuit to the pair of signal lines when the operation power source does not energize the electronic control unit.

According to the electronic control unit with the above-described configuration, when the operation power source is supplied, the first suppression circuit as one of the first and second suppression circuits operates. When the operation power source is not supplied, the second suppression circuit as one of the first and second suppression circuits operates.

Therefore, also in the case where the operation power source is not supplied to the electronic control unit, the ringing suppression effect can be displayed by the second suppression circuit. In the case where the operation power source is supplied to the electronic control unit, the second suppression circuit is isolated from the pair of signal lines and does not operate, so that excessive decrease of the impedance between the pair of signal lines can be avoided. Therefore, an excellent ringing suppression effect can be obtained in both of the case where the operation power source is supplied and the case where the operation power source is not supplied.

Hereinafter, with reference to the drawings, embodiments of the present disclosure will be described.

1. First Embodiment

1-1. Configuration

An electronic control unit (ECU) 21 of a first embodiment illustrated in FIG. 1 is connected to a transmission line 1 as a communication bus. ECU is an abbreviation for Electronic Control Unit.

The transmission line 1 has a pair of signal lines 1H and 1L and transmits a differential signal which changes to the high and low levels by the pair of signal lines 1H and 1L. That is, the transmission line 1 is a differential transmission line. In the present embodiment, the signal line 1H is a high-potential-side signal line, and the signal line 1L is a low-potential-side signal line.

To the transmission line 1, one or more ECUs communicating with the ECU 21 is/are also connected. Although it is assumed that there are two ECUs 22 and 23 in the following description, the number of other ECUs may be one or three or more. A communication system constructed by the ECUs 21 to 23 and the transmission line 1 is, for example, an in-vehicle communication system mounted in a vehicle.

In the present embodiment, when the transmission line 1 is in a non-drive state, both of the signal lines 1H and 1L become, for example, 1.5V as an intermediate voltage. When both of the signal lines 1H and 1L are 1.5V, the voltage of a differential signal (that is, differential voltage) becomes 0V as the voltage of the low level. That is, the differential signal is at the low level. In the present embodiment, 0V is a standard value of the differential voltage of the low level.

When the transmission line 1 is driven by a transmission/reception circuit 32 which is provided for each of the ECUs 21 to 23 and will be described later, the signal line 1H becomes, for example, 2.5V, and the signal line 1L becomes, for example, 0.5V. Consequently, the differential voltage becomes 2V as the high-level voltage. That is, the differential signal becomes the high level. In the present embodiment, 2V is a standard value of the differential voltage of the high level.

Although not illustrated, both ends of the signal lines 1H and 1L are terminated by, for example, a resistive element of 120Ω. The communication protocol in the communication system is, for example, CAN as one of protocols of an in-vehicle LAN. CAN is a registered trademark. In the CAN, the low level of the differential signal is called recessive, and the high level of the differential signal is called dominant. The communication protocol is not limited to CAN.

The ECU 21 has a control unit 31 controlling operations including the communication operation of the ECU 21, the transmission/reception circuit 32 connected to the transmission line 1, and a power source circuit 34.

The transmission/reception circuit 32 converts the differential signal of the transmission line 1 to a reception signal of the high or low level, and outputs the resultant signal to the control unit 31. According to the transmission signal of the high or low level output from the control unit 31, the transmission/reception circuit 32 outputs the differential signal of the high or low level, that is, a signal of dominant or recessive to the transmission line 1.

Consequently, the control unit 31 communicates with the other ECUs 22 and 23 by using the transmission/reception circuit 32. The communication of the control unit 31 with the other ECUs 22 and 23 corresponds to the communication of the ECU 21 with the other ECUs 22 and 23.

The control unit 31 is constructed by a microcomputer having a CPU and a semiconductor memory (hereinbelow, called memory) such as RAM or ROM. Each of the functions of the control unit 31 is realized when the CPU executes a program stored in a non-transitory tangible recording medium. In this example, the memory corresponds to the non-transitory tangible recording medium in which the program is stored. When the program is executed, a method corresponding to the program is executed.

The control unit 31 may have one microcomputer or a plurality of microcomputers. A method of realizing each of the functions of the control unit 31 is not limited to software. A part or all of the functions may be realized by single or a plurality of pieces of hardware. For example, when the function is realized by an electronic circuit as hardware, the electronic circuit may be realized by a digital circuit and/or an analog circuit.

To the ECU 21, voltage (battery voltage) VB of a battery 36 mounted in a vehicle is supplied as an operation power source via a power source relay 37.

The power source circuit 34 generates a power source voltage VCC (for example, 5V) for operating each of units in the ECU 21 from the battery voltage VB supplied via the power source relay 37 and outputs it. In ECU 21, the control unit 31 and the transmission/reception circuit 32 operate by the power source voltage VCC from the power source circuit 34. Therefore, the ECU 21 operates while the power source relay 37 is on.

Consequently, the power source relay 37 is on while the operation conditions of the ECU 21 are satisfied. For example, the power source relay 37 is turned on when the power source switch of the vehicle is turned on. After the ECU 21 finishes all of processes to be executed after the power source switch of the vehicle is turned off, the power source relay 37 is turned off. The power source switch of the vehicle is, for example, an ignition switch or a power switch.

On the other hand, to the other ECUs 22 and 23, the battery voltage VB is always supplied as the operation power source. Consequently, the ECUs 22 and 23 always operate regardless of the on/off state of the power source relay 37.

Further, the ECU 21 has a first suppression circuit 11 and a second suppression circuit 12 as circuits for suppressing ringing which occurs in transmission of a differential signal in the transmission line 1.

The first suppression circuit 11 is configured to operate by using the power source voltage VCC from the power source circuit 34. Since the source of the power source voltage VCC is the battery voltage VB supplied as the operation power source to the ECU 21, it can be said that the first suppression circuit 11 operates by using the operation power source which is supplied to the ECU 21.

On the other hand, the second suppression circuit 12 is configured to operate by the voltage between the pair of signal lines 1H and 1L. The second suppression circuit 12 is connected between the signal lines 1H and 1L via an FET 33 as a switching element provided for the ECU 21. The FET stands for a field effect transistor.

The FET 33 is a P-channel MOSFET. The source of the FET 33 is connected to the signal line 1H, and the drain of the FET 33 is connected to the second suppression circuit 12. The signal line 1L and the second suppression circuit 12 are always connected. Consequently, when the FET 33 is turned on, the second suppression circuit 12 is connected between the signal lines 1H and 1L.

To the gate of the FET 33, a control signal Vo output from the control unit 31 is supplied.

Figure 2:
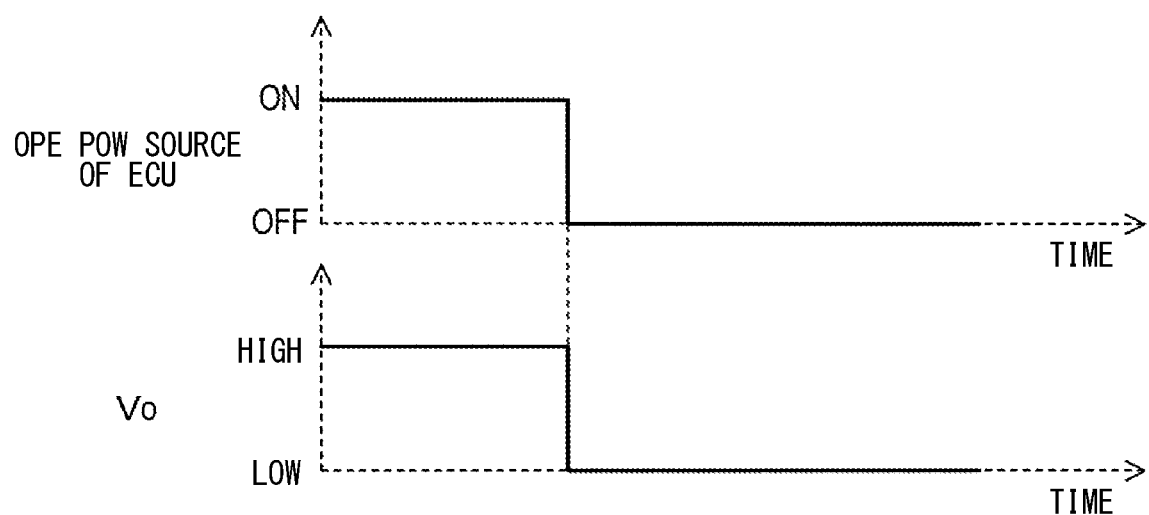
FIG. 2 is an explanatory diagram illustrating the relation between an operation power source and a control signal Vo.

As illustrated in FIG. 2, while the operation power source is supplied to the ECU 21, that is, while the power source voltage VCC is supplied from the power source circuit 34 to the control unit 31, the control unit 31 sets the control signal Vo to the high level. When the control signal Vo is at the high level, the FET 33 is off, so that the second suppression circuit 12 is isolated from the pair of signal lines 1H and 1L (that is, the transmission line 1).

As illustrated in FIG. 2, when the operation power source is not supplied to the ECU 21 and the power source voltage VCC is not supplied to the control unit 31, the control signal Vo from the control unit 31 to the FET 33 becomes the low level. Consequently, the FET 33 is turned on, and the second suppression circuit 12 is connected to the pair of signal lines 1H and 1L.

Next, the first suppression circuit 11 will be described.

Figure 3:
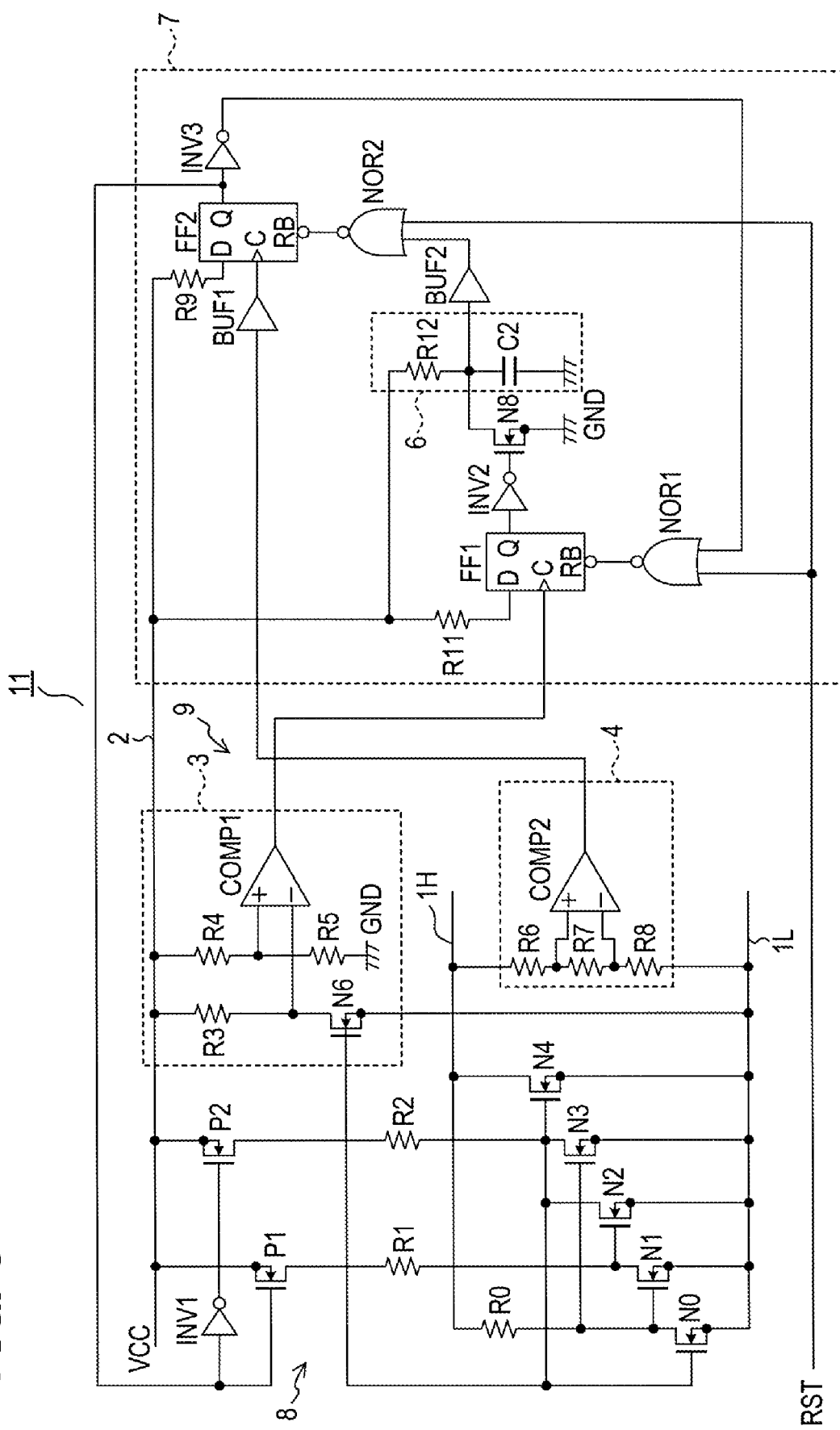
FIG. 3 is a circuit diagram illustrating the configuration of a first suppression circuit.

As illustrated in FIG. 3, the first suppression circuit 11 has nine FETs_N0 to N4, N6, N8, P1, and P2. "_" is inserted between each FET and the reference numeral so as to be easily seen. The FETs_N0 to N4, N6, and N8 are N-channel MOSFETs, and FETs_P1 and P2 are P-channel MOSFETs.

Further, the first suppression circuit 11 has resistive elements R0 to R9, R11, and R12, a capacitor C2, comparators COMP1 and COMP2, inverter gates INV1 to INV3, buffers BUF1 and BUF2, NOR gates NOR1 and NOR2, and D-flip flops FF1 and FF2. The power source of the comparators COMP1 and COMP2, the inverter gates INV1 to INV3, the buffers BUF1 and BUF2, the NOR gates NOR1 and NOR2, and the D flip flops FF1 and FF2 is the power source voltage VCC from the power source circuit 34.

To the signal line 1L, the sources of the five FETs_N0 to N4 are connected. The drain of the FET_N4 as a switching element between the lines is connected to the signal line 1H. The drain of the FET_N0 is connected to the signal line 1H via the resistive element R0 and also connected to the gates of the FETs_N1 and N3.

The sources of the FETs_P1 and P2 are connected to a power source line 2 to which the power source voltage VCC is supplied, and the drain of the FET_P1 is connected to the drain of the FET_N1 and the gate of the FET_N2 via the resistive element R1. The drain of the FET_P2 is connected to the gate of the FET_N0, the drains of the FETs_N2 and N3, and the gate of the FET_N4 via the resistive element R2.

Between the power source line 2 and the signal line 1L, a series circuit of the resistive element R3 and the FET_N6 is connected. The gate of the FET_N6 is connected to the gate of the FET_N0.

Between the power source line 2 and the ground, a series circuit of the resistive elements R4 and R5 is connected. A common connection point of the resistive elements R4 and R5 is connected to a non-inversion input terminal of the comparator COMP1. The inversion input terminal of the comparator COMP1 is connected to the drain of the FET_N6.

The output terminal of the comparator COMP1 is connected to the clock terminal C of the D flip flop FF1. The resistive elements R3 to R5, the FET_N6, and the comparator COMP1 form an on-state checking circuit 3 for checking the on state of the FET_N4.

Between the signal lines 1H and 1L, a series circuit of the resistive elements R6 to R8 is connected. A common connection point of the resistive elements R6 and R7 is connected to a non-inversion input terminal of the comparator COMP2, and a common connection point of the resistive elements R7 and R8 is connected to the inversion input terminal of the comparator COMP2. The output terminal of the comparator COMP2 is connected to the clock terminal C of the D flip flop FF2 via the buffer BUF1. The resistive elements R6 and R7 and the comparator COMP2 form a comparison circuit 4.

The output terminal Q of the D flip flop FF1 is connected to the gate of the FFT N8 via the inverter gate INV2. The source of the FET_N8 is connected to the ground. The drain of the FET_N8 is connected to one of input terminals of the NOR gate NOR2 via the buffer BUF2. Between the power source line 2 and the ground, a series circuit of the resistive element R12 and the capacitor C2 is connected. A common connection point of the resistive element R12 and the capacitor C2 is connected to the drain of the FET_N8. The resistive element R12 and the capacitor C2 form a delay circuit 6.

To the other input terminal of the NOR gate NOR2, a reset signal RST of a high active state is supplied. When the control unit 31 is started with start of output of the power source voltage VCC, the reset signal RST is set to the high state only for a predetermined time by the control unit 31. The output terminal of the NOR gate NOR2 is connected to a reset terminal RB of negative logic of the D flip flop FF2.

The output terminal Q of the D flip flop FF2 is connected to the gate of the FET_P1 and connected to the gate of the FET_P2 via the inverter gate INV1. Further, the output terminal Q of the D flip flop FF2 is connected to one of the input terminals of the NOR gate NOR1 via the inverter gate INV3. To the other input terminal of the NOR gate NOR1, the reset signal RST is supplied. The output terminal of the NOR gate NOR1 is connected to the reset terminal RB of the negative logic of the D flip flop FF1. The delay circuit 6, the D flip flops FF1 and FF2, and their peripheral circuits form an on-state holding circuit 7 for holding the on state of the FET_N4 for predetermined time.

As the operation of the first suppression circuit 11 has been specifically described in the patent literature 1, it is briefly described here.

When a change from the low state (that is, recessive) to the high state (that is, dominant) of the differential signal is detected by the comparison circuit 4, the D flip flop FF2 becomes the set state and the output terminal Q of the D flip flop FF2 becomes the high level, so that the FET_N4 becomes the on state.

In the case where the output terminal Q of the D flip flop FF2 is at the high level, when the differential signal changes from the high level to the low level, the FET_N4 changes from the off state to the on state. When the FET_N4 is turned on, the impedance between the signal lines 1H and 1L decreases, and ringing accompanying the level change of the differential signal is suppressed.

When the FET_N4 is turned on, an output of the on-state checking circuit 3 becomes the high level, and the D flip flop FF1 enters the set state. When the output terminal Q of the D flip flop FF1 becomes the high level, the FET_N8 is turned off, and charging of the capacitor C2 starts in the delay circuit 6 which is made by the resistive element R12 and the capacitor C2. The charging start of the capacitor C2 corresponds to counting start. After that, when predetermined time T1 in which the charging voltage of the capacitor C2 becomes voltage recognized at the high level in the buffer BUF2 lapses, the D flip flop FF2 is reset, the output terminal Q of the D flip flop FF2 becomes the low level, and the FET_N4 is turned off.

When the differential signal changes from the high state to the low state, the first suppression circuit 11 decreases the impedance between the signal lines 1H and 1L by turn-on of the FET_N4, and the state is fixed. After the predetermined time T1 is counted by the delay circuit 6, the on state of the FET_N4 is cancelled. The predetermined time T1 is shorter than the width of one bit of a communication signal.

In such a first suppression circuit 11, the FET_N4 corresponds to a line switching element connected between a pair of signal lines. The part except for the FET_N4 in the circuit configuration illustrated in FIG. 3 corresponds to a control unit 9 controlling the on/off state of the FET_N4. When the change of the level of the differential signal from the high level to the low level is detected, the control unit 9 functions to turn on the line switching element, fix the state and, after counting the predetermined time T1, cancel the on state. The D flip flop FF2 as one of elements of the control unit 9 corresponds to a first flip flop which is reset in the initial state. The D flip flop FF1 corresponds to a second flip flop which is reset in the initial state and, in the set state, outputs a signal for resetting the first flip flop. The delay circuit 6 corresponds to a delay circuit disposed between the output terminal of the second flip flop and the reset terminal of the first flip flop. The comparison circuit 4 corresponds to a first set signal output unit which outputs a signal for setting the first flip flop when a change from the low level to the high level of a differential signal is detected. The on-state checking circuit 3 corresponds to a second set signal output unit which outputs a signal for setting the second flip flop when turn-on of the line switching element is detected. The FETs_N0 to N3, P1, and P2, the inverter gate INV1, and the resistive element R0 correspond to an on-state setting unit 8 which enables a conductivity control terminal (that is, the gate) of the line switching element to be set to the on level when the first flip flop is set.

Figure 4:
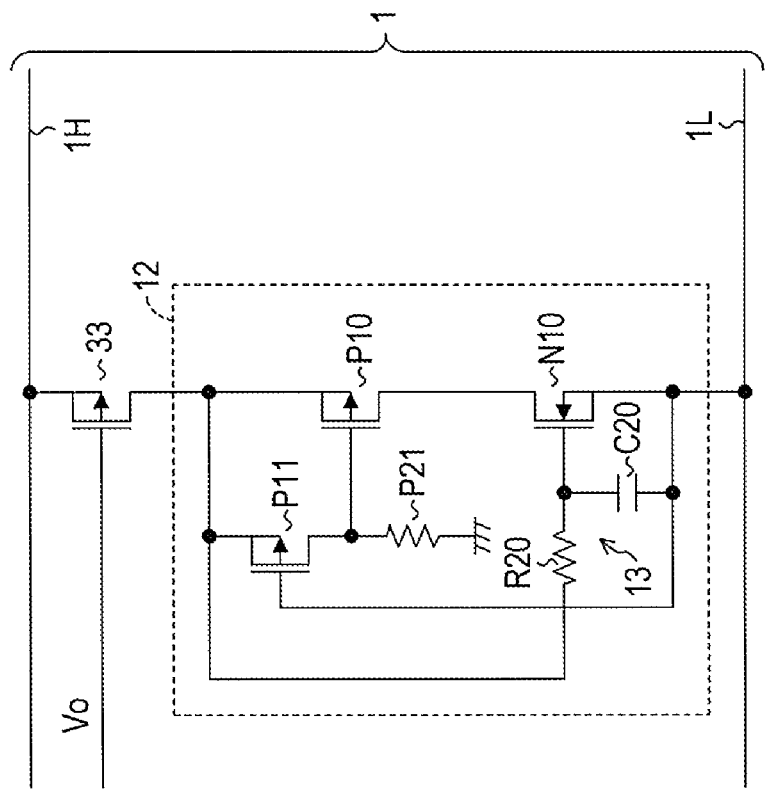
FIG. 4 is a circuit diagram illustrating the configuration of a second suppression circuit.

Next, the second suppression circuit 12 will be described. As illustrated in FIG. 4, the second suppression circuit 12 has three FETs_N10, P10, and P11, resistive elements R21 and R22, and a capacitor C20. The FET_N10 is an N-channel MOSFET and the FETs_P10 and P11 are P-channel MOSFETs.

The FETs_P10 and N10 are connected in series making a drain common between the drain of the FET 33 and the signal line 1L. The source of the FET_P10 is connected to the drain of the FET 33, and the source of the FET_N10 is connected to the signal line 1L.

The source of the FET_P11 is connected to the source of the FET_P10, and the gate of the FET_P10 is connected to the signal line 1L. The drain of the FET_P11 is connected to the gate of the FET_P10 and connected to the ground via the resistive element R21.

The gate of the FET_N10 is connected to the sources of the FETs_P10 and P11 via the resistive element R20 and connected to the signal line 1L via the capacitor C20. The series circuit of the resistive element R20 and the capacitor C20 form a delay circuit 13.

The second suppression circuit 12 is connected between the signal lines 1H and 1L by connecting the sources of the FETs_P10 and P11 to the signal line 1H via the FET 33.

As the operation of the second suppression circuit 12 is specifically described in the patent literature 3, it will be briefly described here on assumption that the FET 33 is on.

When the differential signal is at the high level, the FET_P11 is turned on and the FET_P10 is turned off. The capacitor C20 is charged, and the FET_N10 is turned on.

When the differential signal changes from the high level to the low level, the FET_P11 is turned off, and the FET_P10 is turned on. Then both the FETs_P10 and N10 enter the on state, the impedance between the signal lines 1H and 1L decreases, and ringing accompanying a level change of the differential signal is suppressed.

When the differential signal becomes the low level, the capacitor C20 is discharged via the resistive element R20. When the voltage of the capacitor C20 becomes below the on threshold voltage of the FET_N10, the FET_N10 is turned off.

Therefore, the second suppression circuit 12 decreases the impedance between the signal lines 1H and 1L for the period of predetermined time T2 since the differential signal changes to the low level until the voltage of the capacitor C20 becomes below the on threshold voltage of the FET_N10. When the differential signal returns to the level before the change (that is, the high level) until the predetermined time T2 lapses, the FET_P10 is turned off, so that the decrease of the impedance between the signal lines 1H and 1L is stopped. That is, when the differential signal changes to the low level, the second suppression circuit 12 enters a state of decreasing the impedance between the signal lines 1H and 1L. When the predetermined time T2 lapses or the differential signal returns to the level before the change by the time the predetermined time T2 lapses, the second suppression circuit 12 stops the decrease of the impedance. The predetermined time T2 is shorter than the width of one bit of the communication signal.

1-2. Effects

According to the first embodiment described specifically above, the following effects are produced.

When the operation power source is supplied to the ECU 21 and the ECU 21 operates, the control unit 31 sets the control signal Vo to the FET 33 to the high level to turn off the FET 33, thereby isolating the second suppression circuit 12 from the pair of signal lines 1H and 1L. When the operation power source is not supplied to the ECU 21, the power source voltage VCC is not supplied and the control unit 31 sets the control signal Vo to the low level to turn on the FET 33. As a result, the second suppression circuit 12 is connected to the pair of signal lines 1H and 1L.

In such an ECU 21, when the operation power source is supplied, the first suppression circuit 11 as one of the first and second suppression circuits 11 and 12 operates. When the operation power source is not supplied, the second suppression circuit 12 as one of the first and second suppression circuits 11 and 12 operates.

Consequently, also in the case where the operation power source is not supplied to the ECU 21, the ringing suppression effect can be displayed by the second suppression circuit 12. In the case where the operation power source is supplied to the ECU 21, the second suppression circuit 12 is isolated from the pair of signal lines 1H and 1L and does not operate, so that excessive decrease of the impedance between the pair of signal lines 1H and 1L is avoided. Therefore, in both of the case where the operation power source is supplied and the case where the operation power source is not supplied, the excellent ringing suppression effect can be obtained.

In the embodiment, the control unit 31 corresponds to a switching unit.

2. Second Embodiment

2-1. Different Points from First Embodiment

Since the basic configuration of a second embodiment is similar to that of the first embodiment, the different points will be described below. The reference numerals same as those of the first embodiment have the same configurations, so that the foregoing description may be referred to.

Figure 5:
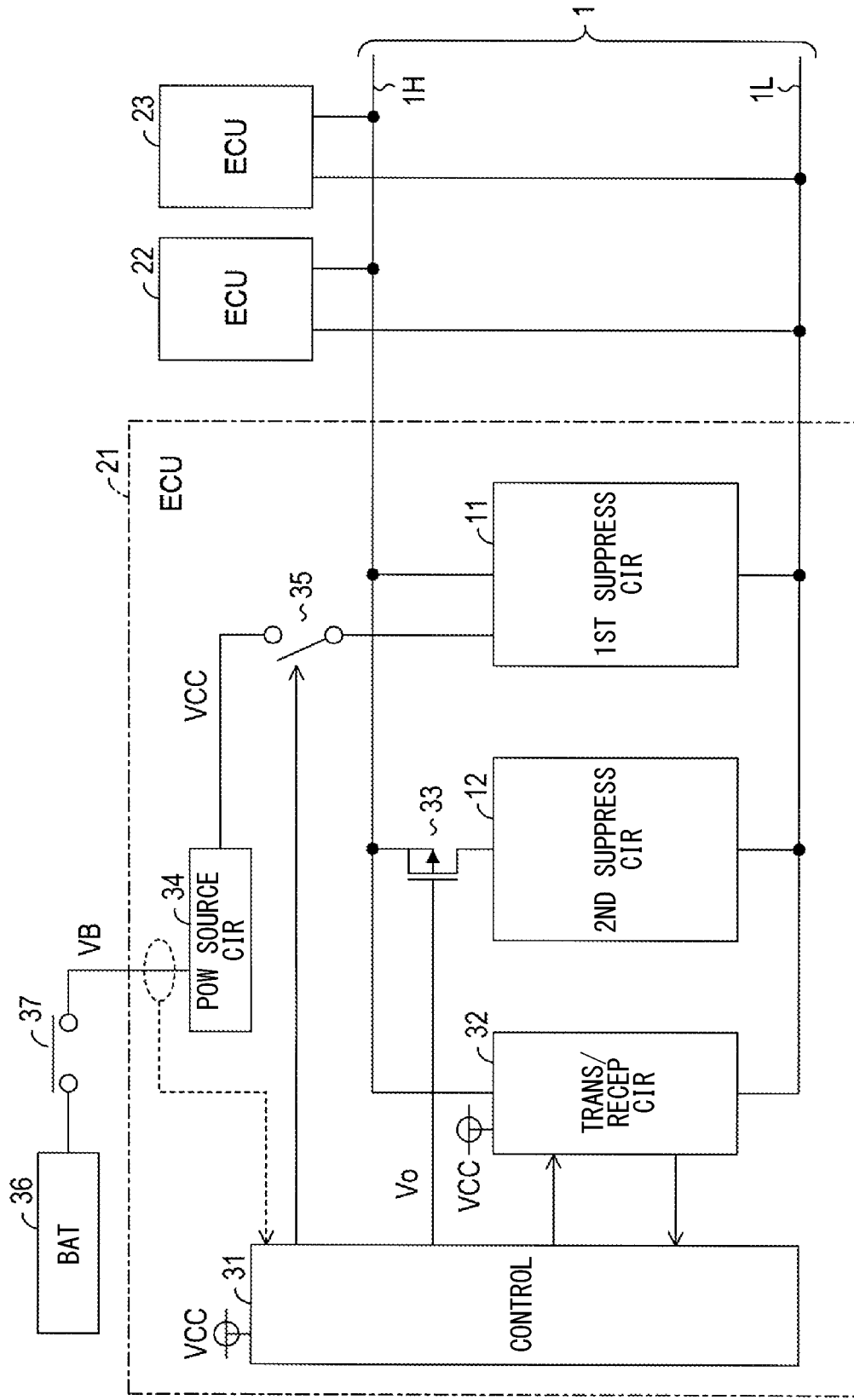
FIG. 5 is a block diagram illustrating the configuration of an electronic control unit of a second embodiment.

The ECU 21 of the second embodiment illustrated in FIG. 5 is different from the ECU 21 of the first embodiment with respect to the following points 2-1-1 to 2-1-3.

2-1-1

From the power source circuit 34 to the first suppression circuit 11, the power source voltage VCC is supplied via a power source switch 35. The on/off state of the power source switch 35 is controlled by the control unit 31. The power source switch 35 is, for example, an analog switch constructed by one or more FETs.

2-1-2

As illustrated by the ellipse and the arrow of a dotted line in FIG. 5, the control unit 31 is configured to detect consumption power of the ECU 21.

For example, the control unit 31 calculates the consumption power from the value of the battery voltage VB supplied to the ECU 21 via the power source relay 37 and the value of current flowing from the power source relay 37 to the ECU 21 (that is, consumption current). For example, when it is assumed that the battery voltage VB is constant, the control unit 31 may be configured to calculate the consumption power from the value of the consumption current.

2-1-3

The control unit 31 alternatively operates the first suppression circuit 11 and the second suppression circuit 12 also in the operation period of the ECU 21. To switch and operate the first suppression circuit 11 and the second suppression circuit 12, the control unit 31 executes a switching control process illustrated in FIG. 6. The switching control process of FIG. 6 is executed, for example, every predetermined time.

Figure 6:
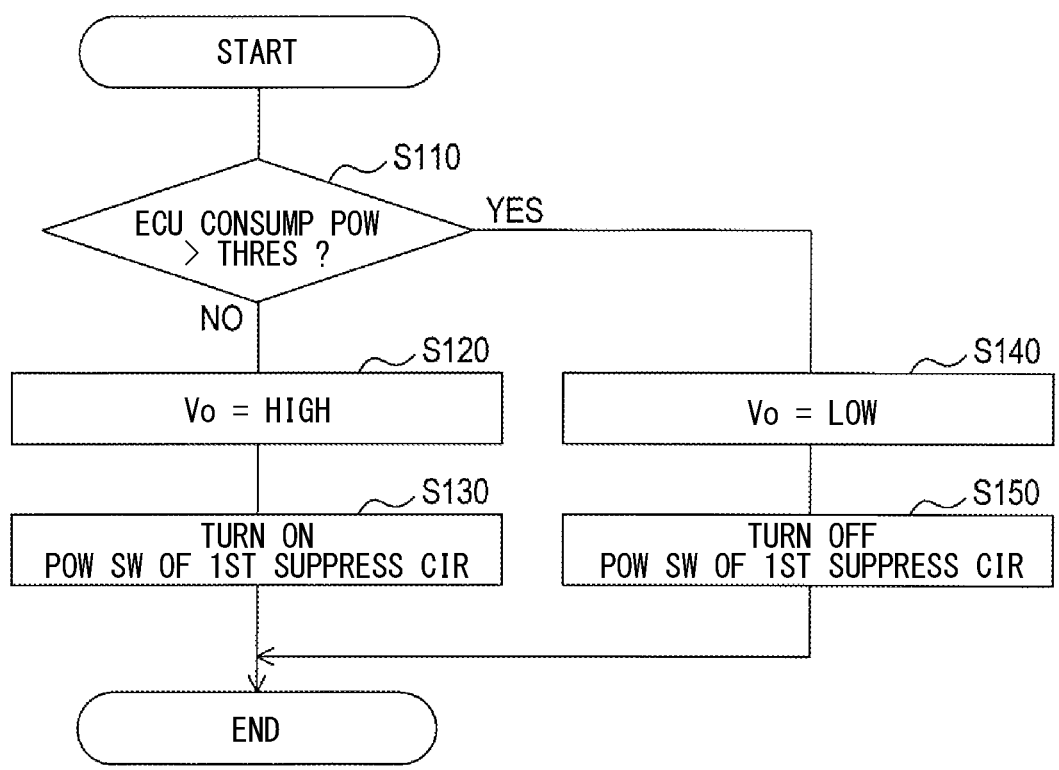
FIG. 6 is a flowchart of a switching control process performed by a control unit of the second embodiment.

As illustrated in FIG. 6, when the switching control process starts, the control unit 31 detects consumption power of the ECU 21 and determines whether the detected consumption power exceeds a predetermined threshold in S110.

When it is determined in S110 that the consumption power does not exceed the threshold, the control unit 31 sets the control signal Vo to the FET 33 to the high level in S120 and turns on the power source switch 35 in the first suppression circuit 11 in S130. After that, the switching control process is finished.

Therefore, when the consumption power does not exceed the threshold, the power source voltage VCC is supplied to the first suppression circuit 11 and the first suppression circuit 11 operates. The second suppression circuit 12 is isolated from the signal lines 1H and 1L.

When it is determined in the S110 that the consumption power exceeds the threshold, the control unit 31 sets the control signal Vo to the FET 33 to the low level in S140, and turns off the power source switch 35 in the first suppression circuit 11 in S150. After that, the switching control process is finished.

Therefore, when the consumption power exceeds the threshold, the power supply to the first suppression circuit 11 is interrupted, and the operation of the first suppression circuit 11 is force-quitted. The second suppression circuit 12 is connected to the signal lines 1H and 1L and operates.

2-2. Effects

According to the second embodiment specifically described above, in addition to the above-described effects of the first embodiment, the following effect is produced.

Even in the case where the operation power source is supplied to the ECU 21, when it is determined that the consumption power of the ECU 21 exceeds the threshold, the control unit 31 interrupts the power supply to the first suppression circuit 11 and connects the second suppression circuit 12 to the pair of signal lines 1H and 1L. Consequently, in the case where the consumption power of the ECU 21 becomes large, while suppressing the consumption power, the ringing suppression function can be worked.

3. Third Embodiment 3-1. Different Points from First Embodiment

Since the basic configuration of a third embodiment is similar to that of the first embodiment, the different points will be described below. The reference numerals same as those of the first embodiment have the same configurations, so that the foregoing description may be referred to.

The ECU 21 of the third embodiment is different from the ECU 21 of the first embodiment with respect to the following points 3-1-1 to 3-1-4.

3-1-1

Like the ECU 21 of the second embodiment, from the power source circuit 34 to the first suppression circuit 11, the power source voltage VCC is supplied via the power source switch 35 illustrated in FIG. 5. The on/off state of the power source switch 35 is controlled by the control unit 31.

3-1-2

The predetermined time T2 in which the second suppression circuit 12 decreases the impedance between the signal lines 1H and 1L is set to be longer than the predetermined time T1 in which the first suppression circuit 11 decreases the impedance between the signal lines 1H and 1L. The predetermined time T1 corresponds to first predetermined time, and the predetermined time T2 corresponds to second predetermined time. In the following, the time of decreasing the impedance between the signal lines 1H and 1L for ringing suppression is called ringing suppression time.

3-1-3

The communication protocol of the communication system in which the ECU 21 is a node is CAN conformed to the flexible data rate (that is, CANFD) which changes the communication speed in a communication frame. Consequently, an arbitration region in the regions in the communication frame transmitted in the transmission line 1 is set to low communication speed (for example, 500 kbps) as compared with that in a following data region.

3-1-4

The control unit 31 alternatively switches and operates the first suppression circuit 11 and the second suppression circuit 12 also in the operation period of the ECU 21. To switch and operate the first suppression circuit 11 and the second suppression circuit 12, the control unit 31 executes the switching control process illustrated in FIG. 7. For example, when the control unit 31 detects SOF (that is, Start Of Frame) indicating start of a communication frame, execution of the switching control process of FIG. 7 is started.

Figure 7:
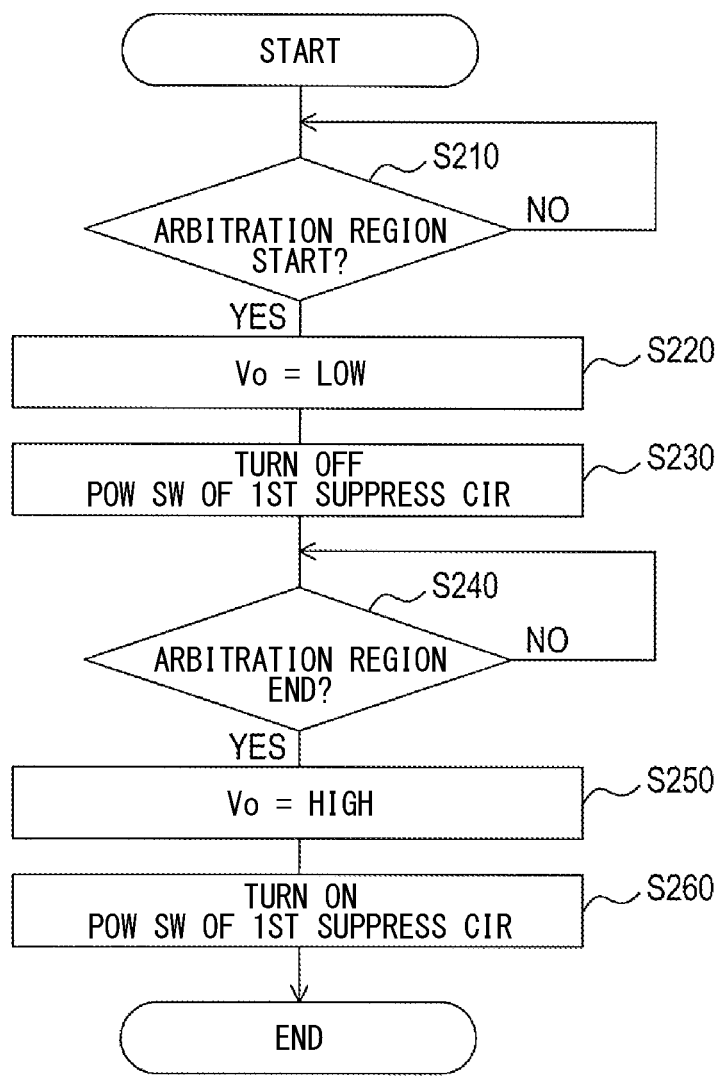
FIG. 7 is a flowchart of a switching control process performed by a control unit of a third embodiment.

As illustrated in FIG. 7, when the switching control process is started, the control unit 31 determines whether the arbitration region of the communication frame starts or not is determined in S210. For example, the control unit 31 determines the start of the arbitration region on the basis of the number of bits from the SOF.

When it is determined in S210 that the arbitration region starts, the control unit 31 sets the control signal Vo to the FET 33 to the low level in S220, and turns off the power source switch 35 of the first suppression circuit 11 in S230. That is, the control unit 31 turns on the FET 33 to connect the second suppression circuit 12 to the pair of signal lines 1H and 1L and, on the other hand, interrupts the power supply to the first suppression circuit 11 to forcedly stop the operation of the first suppression circuit 11.

After that, the control unit 31 determines whether the arbitration region of the communication frame is finished or not. For example, the control unit 31 determines the end of the arbitration region on the basis of the number of bits from the SOF.

When it is determined in S240 that the arbitration region is finished, the control unit 31 sets the control signal Vo to the FET 33 to the high level in S250 and turns on the power source switch 35 of the first suppression circuit 11 in S260. That is, the control unit 31 isolates the second suppression circuit 12 from the signal lines 1H and 1L and supplies the power source voltage VCC to the first suppression circuit 11 to operate the first suppression circuit 11. After that, the control unit 31 finishes the switching control process.

3-2. Effects

According to the third embodiment specifically described above, in addition to the above-described effects of the first embodiment, the following effect is produced.

In the CANFD, since the speed of the arbitration region of the communication frame is low as compared with that in of the data region, there is the possibility that, for example, ringing suppression time (that is, the predetermined time T1) of the first suppression circuit 11 which is set according to ringing in the data region is too short to sufficiently suppress the ringing in the arbitration region.

When it is determined that the part of the communication frame is the arbitration region, the control unit 31 interrupts power supply to the first suppression circuit 11 until the time that arbitration region is finished, and connects the second suppression circuit 12 to the pair of signal lines 1H and 1L. That is, the control unit 31 suppresses ringing by the second suppression circuit 12 in which ringing suppression time is set to be longer than that of the first suppression circuit 11. Consequently, ringing is more easily suppressed also in the arbitration region.

The control unit 31 of the second embodiment may further executes the switching control process of FIG. 7.

In this case, the control unit 31 executes a plurality of switching control processes of FIGS. 6 and 7. For example, the low level of the control signal Vo and the turn-off of the power source switch 35 is executed by the OR of each of the switching control processes, and the high level of the control signal Vo and the turn-on of the power source switch 35 may be executed by the AND of each of the switching control processes. That is, the low level of the control signal Vo and the turn-off of the power source switch 35 may be executed by determining "to set the control signal Vo to the low level and turn off the power source switch 35" by any of the plurality of switching control processes. The setting of the control signal Vo to the high level and the turn-on of the power source switch 35 may be executed when it is determined "to set the control signal Vo to the high level and turn on the power source switch 35" by all of the plurality of switching control processes.

4. Fourth Embodiment 4-1. Different Points from Third Embodiment

Since the basic configuration of a fourth embodiment is similar to that of the third embodiment, the different points will be described below. The reference numerals same as those of the third embodiment have the same configurations, so that the foregoing description may be referred to. In the CANFD as the communication protocol of the communication system in which the ECU 21 is a node, an error frame is set to low communication speed as compared with the data region in a manner similar to the arbitration region in the normal communication frame. The error frame is a frame transmitted when a communication error occurs.

Figure 8:
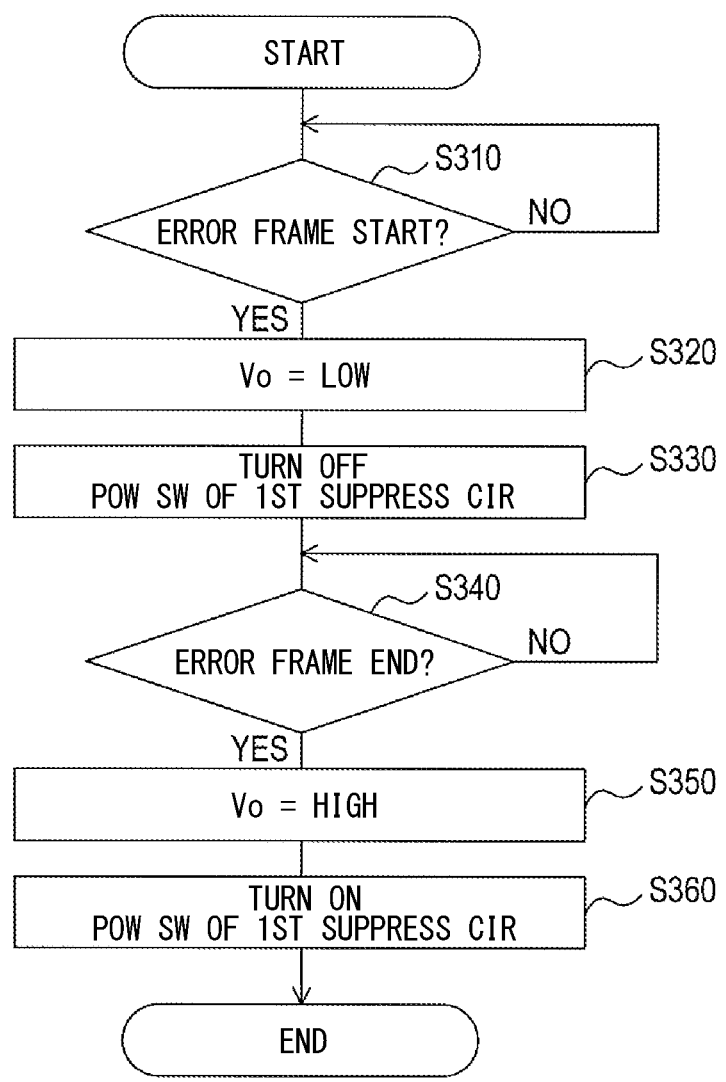
FIG. 8 is a flowchart of a switching control process performed by a control unit of a fourth embodiment.

The ECU 21 of the fourth embodiment is different from the ECU 21 of the third embodiment with respect to the point that the control unit 31 executes the switching control process of FIG. 8 in place of the switching control process of FIG. 7.

As illustrated in FIG. 8, when the switching control process is started, the control unit 31 determines whether an error frame starts or not in S310. For example, the control unit 31 determines the start of an error frame from a bit column flowing in the transmission line 1.

When it is determined in S310 that an error frame starts, the control unit 31 sets the control signal Vo to the FET 33 to the low level in S320 and turns off the power source switch 35 of the first suppression circuit 11 in S330. That is, the control unit 31 turns on the FET 33 to connect the second suppression circuit 12 to the pair of signal lines 1H and 1L and, on the other hand, interrupts the power supply to the first suppression circuit 11 to forcedly stop the operation of the first suppression circuit 11.

After that, the control unit 31 determines whether the error frame ends or not in S340. For example, the control unit 31 determines the end of the error frame on the basis of a bit column flowing in the transmission line 1.

When it is determined in S440 that the error frame ends, the control unit 31 sets the control signal Vo to the FET 33 to the high level in S350 and turns on the power source switch 35 of the first suppression circuit 11 in S360. That is, the control unit 31 isolates the second suppression circuit 12 from the signal lines 1H and 1L and supplies the power source voltage VCC to the first suppression circuit 11 to operate the first suppression circuit 11. After that, the control unit 31 finishes the switching control process.

4-2. Effects

According to the fourth embodiment specifically described above, in addition to the above-described effects of the first embodiment, the following effects are produced.

Since the speed in an error frame is low as compared with that in the data region in a normal communication frame, for example, there is the possibility that ringing suppression time (that is, predetermined time T1) of the first suppression circuit 11 which is set in accordance with ringing in the data region is too short to sufficiently suppress ringing in the error frame.

When it is determined that the communication frame transmitted in the transmission line 1 is an error frame, the control unit 31 interrupts the power supply to the first suppression circuit 11 until it is determined that an error frame ends and connects the second suppression circuit 12 to the pair of signal lines 1H and 1L. That is, with respect to the error frame, the control unit 31 suppresses ringing by the second suppression circuit 12 in which ringing suppression time is set to be longer than that in the first suppression circuit 11. Consequently, ringing also in an error frame is sufficiently easily suppressed.

The control unit 31 of the third embodiment may execute also the switching control process of FIG. 8. The control unit 31 of the second embodiment may further execute the switching control process of FIG. 8 or may further execute each of the switching control processes of FIGS. 7 and 8. In the case where the control unit 31 executes a plurality of switching control processes, execution of setting of the low level of the control signal Vo and turn-off of the power source switch 35 and setting of the high level of the control signal Vo and turn-on of the power source switch 35 is as described above.

5. Fifth Embodiment 5-1. Different Points from Third Embodiment

Since the basic configuration of a fifth embodiment is similar to that of the third embodiment, the different points will be described below. The reference numerals same as those of the third embodiment have the same configurations, so that the foregoing description may be referred to.

Figure 9:
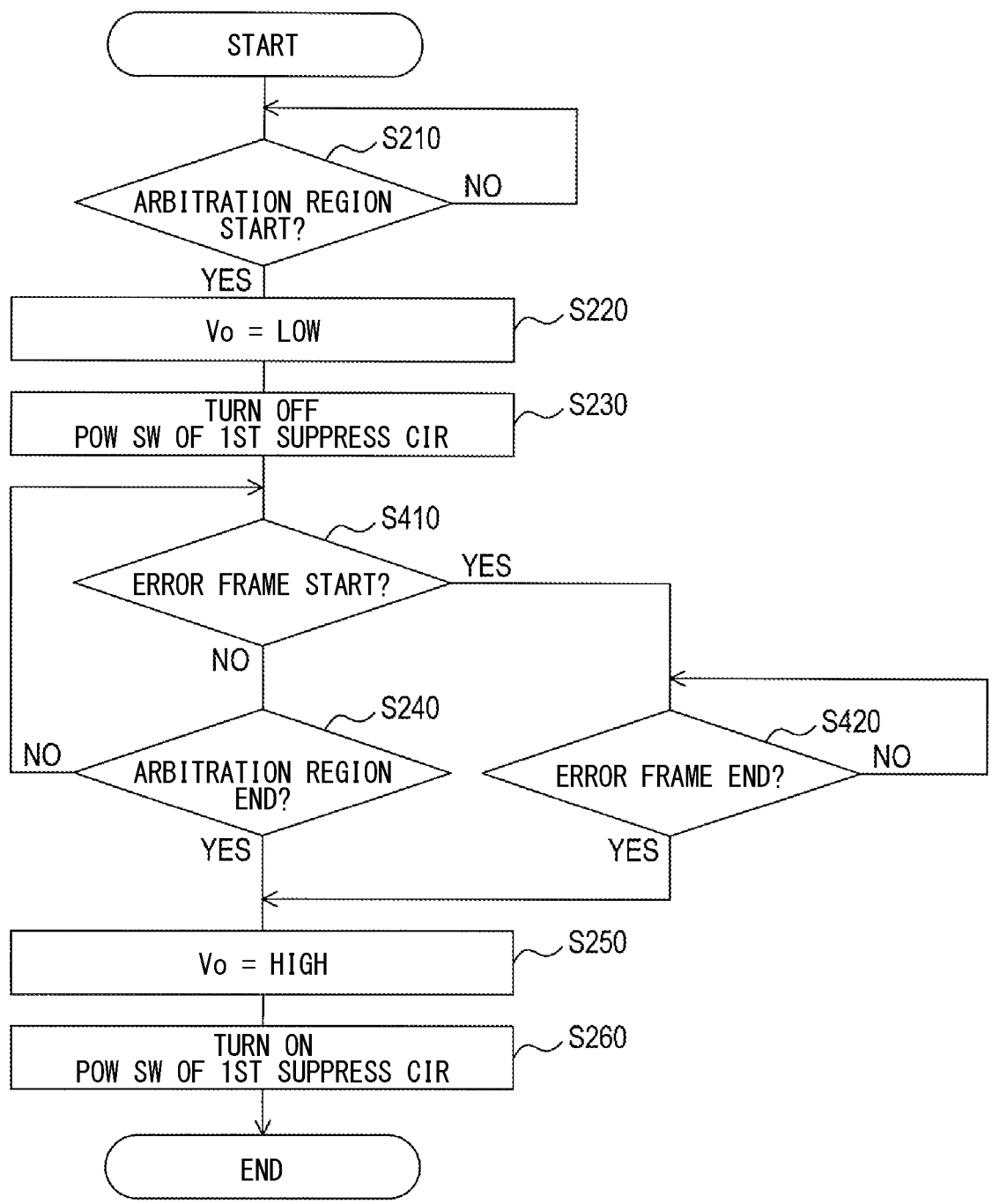
FIG. 9 is a flowchart of a switching control process performed by a control unit of a fifth embodiment.

The ECU 21 of the fifth embodiment is different from the ECU 21 of the third embodiment with respect to the point that the control unit 31 executes a switching control process of FIG. 9 in place of the switching control process of FIG. 7.

The switching control process of FIG. 9 is different from the switching control process of FIG. 7 with respect to the point that S410 and S420 are added. In FIG. 9, the same step numbers are designated to processes same as those in FIG. 7, so that the detailed description will not be repeated.

As illustrated in FIG. 9, when it is determined in S210 that an arbitration region starts, the control unit 31 sets the control signal Vo to the FET 33 to the low level in S220, and turns off the power source switch 35 in S230. The control unit 31 advances to S410 and, in a manner similar to S310 in FIG. 8, determines whether an error frame starts or not.

When it is determined in S410 that an error frame does not start, the control unit 31 advances to S240 and determines that whether the arbitration region in a communication frame ends or not. When it is determined in S240 that the arbitration region does not end, the control unit 31 returns to S410.

In the case where it is determined in S240 that the arbitration region ends, the control unit 31 sets the control signal Vo to the FET 33 to the high level in S250, turns on the power source switch 35 in S260 and, after that, finishes the switching control process.

When it is determined in the S410 that an error frame starts, the control unit 31 advances to S420, determines whether an error frame ends or not, and waits until the error frame ends. When it is determined in S420 that the error frame ends, the control unit 31 performs the processes in S250 and S260 and, after that, finishes the switching control process.

That is, when an error frame is found during a period of receiving the arbitration region, regardless of whether the arbitration region or not, the control unit 31 continuously stops the first suppression circuit 11 and operates the second suppression circuit 12 until the error frame ends.

5-2. Effects

According to the fifth embodiment specifically described above, both of the effects described with respect to the third embodiment and the effects described with respect to the fourth embodiment are produced. That is, ringing is sufficiently easily suppressed in the arbitration region in a normal communication frame and an error frame.

The control unit 31 of the second embodiment may further execute the switching control process of FIG. 9.

6. Sixth Embodiment 6-1. Different Points from First Embodiment

Since the basic configuration of a sixth embodiment is similar to that of the first embodiment, the different points will be described. Since the same reference numerals as those of the first embodiment indicate the same configurations, the foregoing description may be referred to.

Figure 10:
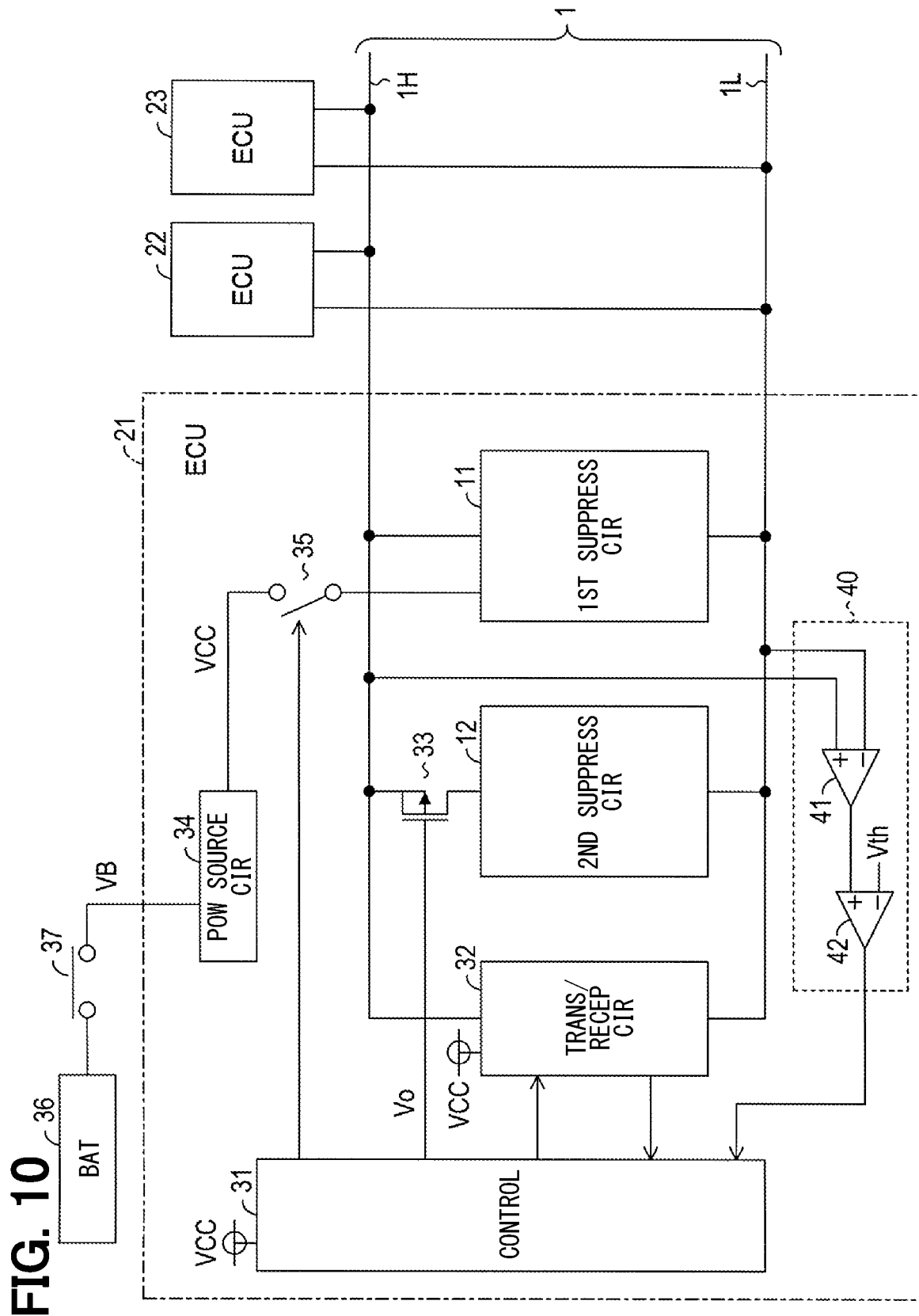
FIG. 10 is a block diagram illustrating the configuration of an electronic control unit of a sixth embodiment.

The ECU 21 of the sixth embodiment illustrated in FIG. 10 is different from the ECU 21 of the first embodiment with respect to the point that the following components 6-1-1 to 6-1-3 are further provided.

6-1-1

Like in the ECU 21 of the second embodiment, the power source voltage VCC is supplied from the power source circuit 34 to the first suppression circuit 11 via the power source switch 35. The turn-on/off of the power source switch 35 is controlled by the control unit 31.

6-1-2

The ECU 21 has a detection unit 40 for detecting that noise contained in a differential signal. The detection unit 40 has an operational amplifier 41 amplifying a voltage difference (that is, differential voltage) between the signal lines 1H and 1L and outputting the resultant and a comparator 42 comparing the output voltage of the operational amplifier 41 and a predetermined threshold voltage Vth.

The amplification degree of the operational amplifier 41 and the threshold voltage Vth are set so that an output of the comparator 42 becomes the high level in the case where a differential voltage is larger than predetermined voltage (for example, 1V) between a high-level standard value (that is, 2V) and a low-level standard value (that is, 0V) of the differential voltage. An output of the comparator 42 is input as an output of the detection unit 40 to the control unit 31.

6-1-3

Also in the operation period of the ECU 21, the control unit 31 alternatively switches and operates the first suppression circuit 11 and the second suppression circuit 12. To alternatively switch and operate the first suppression circuit 11 and the second suppression circuit 12, the control unit 31 executes switching control process illustrated in FIG. 11. For example, when the control unit 31 detects SOF indicating the start of a communication frame, execution of the switching control process of FIG. 11 is started.

Figure 11:
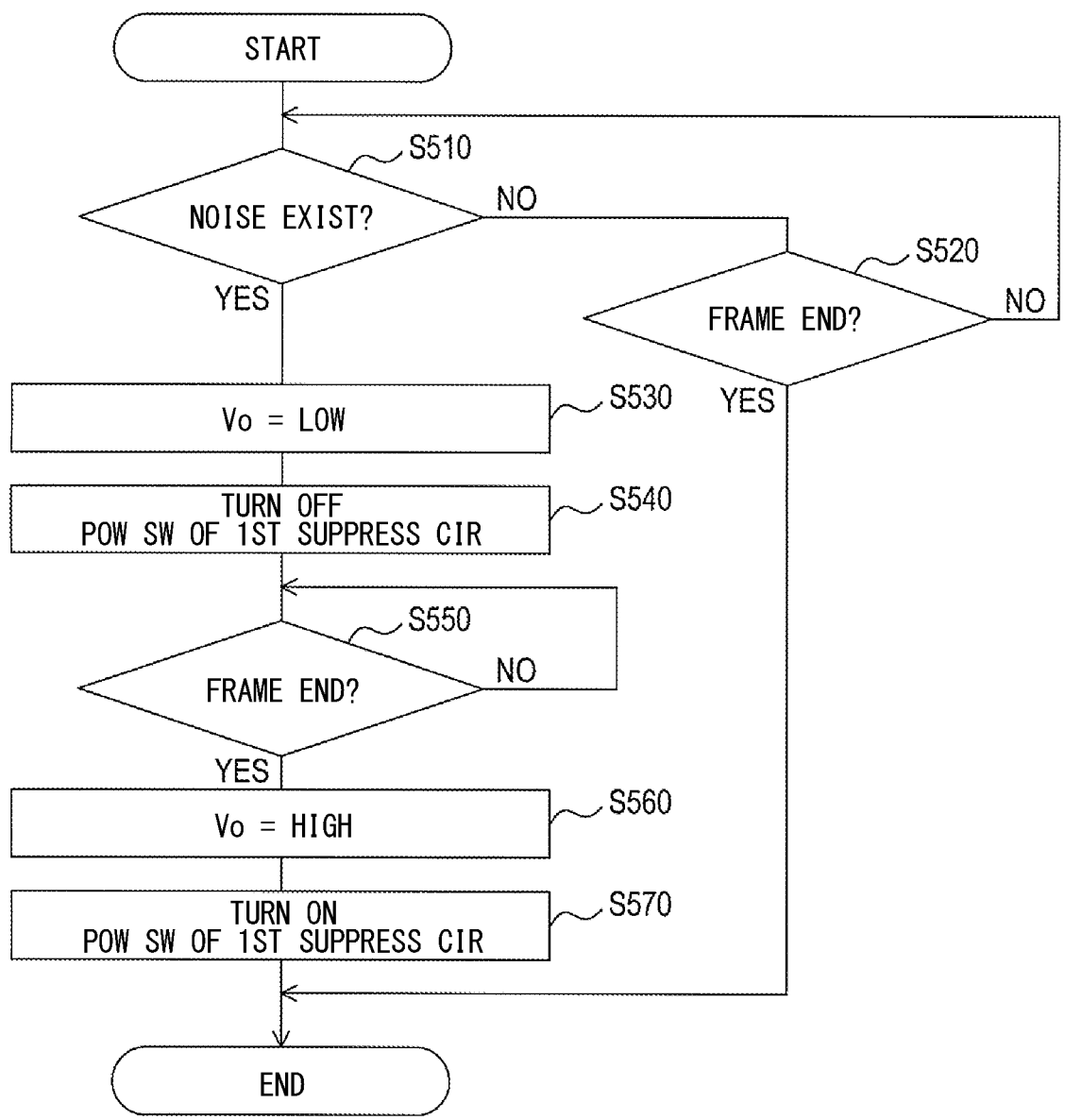
FIG. 11 is a flowchart of a switching control process performed by a control unit of the sixth embodiment.

As illustrated in FIG. 11, when the control unit 31 starts the switching control process, it is determined in S510 whether noise is contained in a differential signal in the transmission line 1 or not. For example, the control unit 31 measures an interval in which level changes occur in outputs of the detection unit 40 and, when the measured interval is shorter than normal high-level time or low-level time of the differential signal, it is determined that noise occurs, that is, noise is contained in the differential signal.

When it is determined in S510 that there is no noise, that is, noise is not contained in a differential signal, the control unit 31 advances to S520 and determines whether a communication frame ends or not. For example, when EOF (that is, End Of Frame) indicating the end of a communication frame is detected, the control unit 31 determines that the communication frame ends.

When it is determined in the S520 that the communication frame does not end, the control unit 31 returns to S510. When it is determined in the S520 that the communication frame ends, the control unit 31 finishes the switching control process.

On the other hand, when it is determined in the S510 that there is noise, the control unit 31 sets the control signal Vo to the FET 33 to the low level in S530, and turns off the power source switch 35 of the first suppression circuit 11 in S540. After that, the control unit 31 determines whether or not the communication frame ends in S550 and, when it is determined that the communication frame ends, advances to S560. The control unit 31 sets the control signal Vo to the FET 33 to the high level in S560 and turns on the power source switch 35 of the first suppression circuit 11. After that, the control unit 31 finishes the switching control process.

That is, when it is determined that noise is contained in a differential signal of a communication frame transmitted, the control unit 31 interrupts power supply to the first suppression circuit 11 and connects the second suppression circuit 12 to the pair of signal lines 1H and 1L until it is determined that the communication frame ends.

6-2. Effects

According to the six embodiment described specifically above, in addition to the effects of the first embodiment, the following effects are produced.

When the level of a differential signal changes, the first suppression circuit 11 decreases the impedance between the signal lines 1H and 1L by turning on the FET_N4 and fix the state only for the predetermined time T1. Consequently, there is an advantage that ringing suppression time can be easily made always constant.

However, when the first suppression circuit 11 reacts to instantaneous noise contained in a differential signal, the impedance between the signal lines 1H and 1L is decreased for only the predetermined time T1 since the level change due to noise occurs, not the level change of a differential signal based on transmission data. Therefore, appearance of the high level of the differential signal is suppressed and, for example, the possibility of erroneous determination of bits on a reception side becomes high.

On the other hand, the second suppression circuit 12 is configured that even when the level of a differential signal changes and the impedance between the signal lines 1H and 1L decreases, if the differential signal returns to the level before the change by the time the predetermined time T2 lapses, the decrease in the impedance is stopped. Consequently, even if the second suppression circuit 12 reacts to noise, the time in which the impedance between the signal lines 1H and 1L decreases is shorter than the time width of noise and is time which is zero or can be regarded as almost zero. The influence on communication is smaller than that in the case where the first suppression circuit 11 reacts to noise.

When it is determined that noise is contained in a differential signal, the control unit 31 does not make the first suppression circuit 11 operate and connects the second suppression circuit 12 to the pair of signal lines 1H and 1L for a period until it is determined that the communication frame ends. That is, when noise is contained in a differential signal, the control unit 31 suppresses ringing by the second suppression circuit 12. Consequently, in environment such that noise is frequently contained in a differential signal, occurrence of a communication error can be suppressed.

7. Other Embodiments

The embodiments of the present disclosure have been described above but the present disclosure is not limited to the forgoing embodiments but can be variously modified.

The first suppression circuit 11 is not limited to the circuit illustrated in FIG. 3 but may be, for example, a circuit having functions and a configuration described in the patent literature 2. The second suppression circuit 12 is also not limited to the circuit illustrated in FIG. 4 but, for example, may be configured so as to decrease the impedance between the signal lines 1H and 1L by turning on a single transistor provided between the signal lines 1H and 1L. In the case where a differential signal changes from the low level to the high level, the first suppression circuit 11 and the second suppression circuit 12 may decrease the impedance between the signal lines 1H and 1L.

A plurality of functions of a single component in the foregoing embodiments may be realized by a plurality of components or a single function of a single component may be realized by a plurality of components. A plurality of functions of a plurality of components may be realized by a single component, or a single function realized by a plurality of components may be realized by a single component. A part of the configurations in the foregoing embodiments may be omitted. At least a part of the configurations in the foregoing embodiments may be added to or replaced by another configuration in the embodiments. Every mode included in the technical idea specified by the words described in the scope of patent claims is an embodiment of the present disclosure.

The present disclosure can be realized not only by the above-described ECU 21 but also various forms such as a communication system including the ECU 21 as a component, a program for making a computer as the ECU 21 function, a non-transitory tangible recording medium such as a semiconductor memory in which the program is recorded, and a ringing suppressing method.

It is noted that a flowchart or the processing of the flowchart in the present application includes sections (also referred to as steps), each of which is represented, for instance, as S110. Further, each section can be divided into several sub-sections while several sections can be combined into a single section. Furthermore, each of thus configured sections can be also referred to as a device, module, or means.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An electronic control unit that is coupled to a transmission line transmitting a differential signal, which changes between a high level and a low level, via a pair of a high-potential-side signal line and a low-potential-side signal line, and communicates with at least another device via the transmission line, the electronic control unit comprising:
a first suppression circuit and a second suppression circuit for suppressing a ringing effect which occurs in transmission of the differential signal; and
a switching unit, wherein:
the first suppression circuit is configured to operate using an operation power source energizing the electronic control unit for operating the electronic control unit, and is configured to have at least one function of decreasing an impedance between the pair of signal lines for a first predetermined time interval when a level of the differential signal changes;
the second suppression circuit is configured to operate by a voltage between the pair of signal lines, and configured to decrease the impedance between the pair of signal lines for a second predetermined time interval when the level of the differential signal changes; and
the switching unit is configured to isolate the second suppression circuit from the pair of signal lines when the operation power source energizes the electronic control unit and the electronic control unit functions, and configured to connect the second suppression circuit to the pair of signal lines when the operation power source does not energize the electronic control unit.

2. The electronic control unit according to claim 1, wherein:
the switching unit determines whether electric power consumption of the electronic control unit exceeds a threshold when the operation power source energizes the electronic control unit; and
the switching unit interrupts power supply to the first suppression circuit to forcedly stop operating the first suppression circuit, and connects the second suppression circuit to the pair of signal lines when the switching unit determines that the electric power consumption exceeds the threshold.

3. The electronic control unit according to claim 1, wherein:
the second predetermined time interval is set to be longer than the first predetermined time interval;
the switching unit determines whether a part of a communication frame transmitted in the transmission line is disposed in an arbitration region when the operation power source energizes the electronic control unit;
when the switching unit determines that the part of the communication frame is disposed in the arbitration region, the switching unit interrupts the power supply to the first suppression circuit to forcedly stop operating the first suppression circuit, and connects the second suppression circuit to the pair of signal lines until the switching unit determines that the arbitration region ends.

4. The electronic control unit according to claim 1, wherein:
the second predetermined time interval is set to be longer than the first predetermined time interval;
the switching unit determines whether a communication frame transmitted in the transmission line is an error frame when the operation power source energizes the electronic control unit; and
when the switching unit determines that the communication frame is the error frame, the switching unit interrupts power supply to the first suppression circuit to forcedly stop operating the first suppression circuit, and connects the second suppression circuit to the pair of signal lines until the switching unit determines that the error frame ends.

5. The electronic control unit according to claim 1, wherein:
the first suppression circuit has a function of:
decreasing an impedance between the pair of signal lines and maintaining a decreasing state when the level of the differential signal changes; and
after the first predetermined time interval elapses, cancelling the decreasing state of decreasing the impedance;
the second suppression circuit is configured to be in the decreasing state of decreasing the impedance between the pair of signal lines when the level of the differential signal changes, and configured to stop decreasing the impedance when the second predetermined time interval elapses or the level of the differential signal returns to the level before changing until the second predetermined time interval elapses;

the switching unit is configured to determine whether a noise is superimposed on the differential signal when the operation power source energizes the electronic control unit; and when the switching unit determines that the noise is superimposed on the differential signal, the switching unit interrupts power supply to the first suppression circuit to forcedly stop operating the first suppression circuit, and connects the second suppression circuit to the pair of signal lines until the switching unit determines that a communication frame transmitted in the transmission line ends.

* * * * *